(12) United States Patent
Kwon et al.

(10) Patent No.: US 8,703,301 B2
(45) Date of Patent: Apr. 22, 2014

(54) ORGANIC LIGHT EMITTING DEVICE COMPRISING LAYER COMPRISING ORGANIC-METAL COMPLEX AND METHOD OF PREPARING THE SAME

(75) Inventors: O-hyun Kwon, Seoul (KR); Sang-hoon Park, Seongnam-si (KR); Byoung-ki Choi, Hwaseong-si (KR); Dong-woo Shin, Seoul (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 409 days.

(21) Appl. No.: 12/435,762

(22) Filed: May 5, 2009

(65) Prior Publication Data
US 2009/0309491 A1  Dec. 17, 2009

(30) Foreign Application Priority Data

Jun. 13, 2008 (KR) ........................ 10-2008-0055837

(51) Int. Cl.
*H01L 51/54* (2006.01)
*H05B 33/14* (2006.01)
*C09K 11/06* (2006.01)

(52) U.S. Cl.
USPC ............... 428/690; 428/917; 427/58; 427/66; 313/504; 313/506; 257/40

(58) Field of Classification Search
None
See application file for complete search history.

(56) References Cited

U.S. PATENT DOCUMENTS

| 6,630,253 | B1 * | 10/2003 | Tanaka et al. | 428/690 |
| 2005/0064241 | A1 * | 3/2005 | Kambe et al. | 428/690 |
| 2007/0020485 | A1 * | 1/2007 | Kita et al. | 428/690 |
| 2007/0092755 | A1 * | 4/2007 | Begley et al. | 428/690 |

* cited by examiner

*Primary Examiner* — Andrew K Bohaty
(74) *Attorney, Agent, or Firm* — F. Chau & Associates, LLC

(57) ABSTRACT

Provided are an organic light emitting device including a substrate; a first electrode; a second electrode; and an organic layer interposed between the first electrode and the second electrode, wherein the organic layer includes a first layer including an organic-metal complex represented by Formula 1 below, and a method of preparing the same:

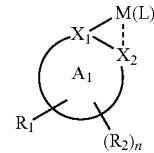

Formula 1 wherein Formula 1 is described in the description of the invention.

8 Claims, 1 Drawing Sheet

ORGANIC LIGHT EMITTING DEVICE COMPRISING LAYER COMPRISING ORGANIC-METAL COMPLEX AND METHOD OF PREPARING THE SAME

CROSS-REFERENCE TO RELATED PATENT APPLICATION

This application claims the benefit of Korean Patent Application No. 10-2008-0055837, filed on Jun. 13, 2008, the disclosure of which is hereby incorporatedby reference herein in its entirety.

BACKGROUND OF THE INVENTION

1. Technical Field

The present disclosure relates to an organic light emitting device (OLED) and to a method of preparing the same, and more particularly, an OLED including: a substrate, a first electrode, a second electrode and an organic layer interposed between the first electrode and the second electrode, wherein the organic layer includes a first layer including an organic-metal complex.

2. Description of the Related Art

Organic light emitting devices (OLEDs) have beneficial brightness, driving voltage, and quick response characteristics, and can realize multi color display. Due to the above-mentioned benefits, a large amount of research into OLEDs has been carried out.

Typically, an OLED has an anode/organic emission layer (EML)/cathode structure. However, the OLED can also have various other structures, such as an anode/hole injection layer (HIL)/hole transport layer (HTL)/EML/electron transport layer (ETL)/electron injection layer (EIL)/cathode structure or an anode/HIL/HTL/EML/hole blocking layer (HBL)/ETL/EIL/cathode structure.

Materials that may be used in OLEDs can be classified into either vacuum depositable materials or solution coatable materials according to a method of preparing an organic layer. The vacuum depositable materials may have a vapor pressure of about $10^{-6}$ torr or greater at the temperature of about 500° C. or less and be low molecular materials, such as for example, having a weight average molecular weight of about 1200 or less. The solution coatable materials may be highly soluble in solvents to be prepared in solution phase, and include aromatic or heterocyclic groups.

When an OLED is manufactured by vacuum deposition, costs may be high due to expensive vacuum systems and high resolution pixels may not be easily manufactured if a shadow mask is used to prepare pixels for a natural color display. On the other hand, an OLED can be manufactured relatively easily and inexpensively using a solution coating method such as inkjet printing, screen printing and spin coating and can have relatively high resolution compared to when using a shadow mask.

However, properties such as thermal stability and color purity of materials available for the vacuum deposition may be superior to those available for the solution coating. Furthermore, even though the solution coated materials have beneficial thermal stability and color purity, the solution coated materials in the organic layer may crystallize to have a particle size capable of scattering visible rays which in turn may cause white turbidity or may have pin holes thereby deteriorating the OLED.

As properties of the conventional materials that are used to form an organic layer may not meet desired levels, there is a need to develop a material having benefical properties.

SUMMARY OF THE INVENTION

In accordance with an exemplary embodiment of the present invention, an organic light emitting device (OLED) is provided. The OLED includes a substrate, a first electrode, a second electrode and an organic layer interposed between the first electrode and the second electrode. The organic layer includes a first layer including an organic-metal complex represented by Formula 1 below:

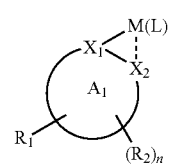

Formula 1 wherein $X_1$ and $X_2$ are nitrogen;

$A_1$ is a 5-membered, 8-membered, or 9-membered heteroaromatic ring system having at least three nitrogen atoms;

$R_1$ is a group represented by $-(Y)_m-Q_1$, wherein Y is a substituted or unsubstituted $C_5$-$C_{30}$ arylene group or a substituted or unsubstituted $C_2$-$C_{30}$ heteroarylene group, $Q_1$ is a substituted or unsubstituted $C_5$-$C_{30}$ arylene group or a substituted or unsubstituted $C_2$-$C_{30}$ heteroarylene group, and m is 0, 1, 2, or 3;

$R_2$ is a halogen atom, a cyano group, a hydroxyl group, an amino group, a substituted or unsubstituted $C_1$-$C_{20}$ alkyl group, a substituted or unsubstituted $C_1$-$C_{20}$ alkoxy group, a substituted or unsubstituted $C_5$-$C_{30}$ cycloalkyl group, a substituted or unsubstituted $C_2$-$C_{30}$ heterocycloalkyl group, a substituted or unsubstituted $C_5$-$C_{30}$ aryl group, or a substituted or unsubstituted $C_2$-$C_{30}$ heteroaryl group;

n is 0, 1, 2, or 3;

M is an alkali metal; and

L is an organic ligand represented by one of Formulae 2a, 2b, and 2c below:

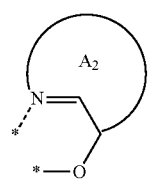

Formula 2a

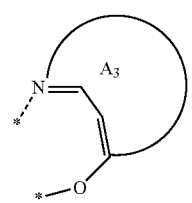

Formula 2b

-continued

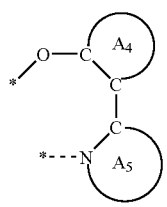

Formula 2c wherein $A_2$, $A_3$ and $A_5$ are each independently a substituted or unsubstituted $C_2$-$C_{30}$ heteroaromatic ring having at least one nitrogen atom;

$A_4$ is a substituted or unsubstituted $C_5$-$C_{30}$ aromatic ring or a substituted or unsubstituted $C_2$-$C_{30}$ heteroaromatic ring; and

* is a binding site with M.

In accordance with another exemplary embodiment of the present invention, a method of preparing an organic light emitting device (OLED) is provided. The method includes
  forming a first electrode on a substrate,
  forming an organic layer including a first layer including an organic-metal complex represented by Formula 1 on the first electrode and
  forming a second electrode on the organic layer.

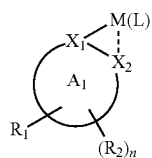

Formula 1 wherein $X_1$ and $X_2$ are nitrogen;

$A_1$ is a 5-membered, 8-membered, or 9-membered heteroaromatic ring system having at least three nitrogen atoms;

$R_1$ is a group represented by —(Y)$_m$-$Q_1$, wherein Y is a substituted or unsubstituted $C_5$-$C_{30}$ arylene group or a substituted or unsubstituted $C_2$-$C_{30}$ heteroarylene group, $Q_1$ is a substituted or unsubstituted $C_5$-$C_{30}$ arylene group or a substituted or unsubstituted $C_2$-$C_{30}$ heteroarylene group, and m is 0, 1, 2, or 3;

$R_2$ is a halogen atom, a cyano group, a hydroxyl group, an amino group, a substituted or unsubstituted $C_1$-$C_{20}$ alkyl group, a substituted or unsubstituted $C_1$-$C_{20}$ alkoxy group, a substituted or unsubstituted $C_5$-$C_{30}$ cycloalkyl group, a substituted or unsubstituted $C_2$-$C_{30}$ heterocycloalkyl group, a substituted or unsubstituted $C_5$-$C_{30}$ aryl group, or a substituted or unsubstituted $C_2$-$C_{30}$ heteroaryl group;

n is 0, 1, 2, or 3;

M is an alkali metal; and

L is an organic ligand represented by one of Formulae 2a, 2b, and 2c below:

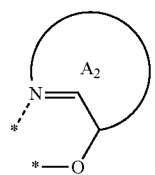

Formula 2a

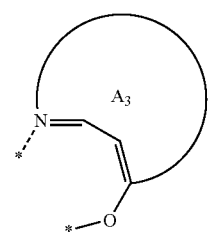

Formula 2b

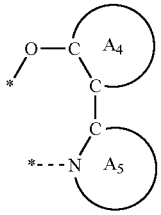

Formula 2c wherein $A_2$, $A_3$ and $A_5$ are each independently a substituted or unsubstituted $C_2$-$C_{30}$ heteroaromatic ring having at least one nitrogen atom;

$A_4$ is a substituted or unsubstituted $C_5$-$C_{30}$ aromatic ring or a substituted or unsubstituted $C_2$-$C_{30}$ heteroaromatic ring; and

* is a binding site with M.

BRIEF DESCRIPTION OF THE DRAWINGS

Exemplary embodiments of the present invention can be understood in more detail from the following description taken in conjunction with reference to the attached drawings in which.

Figure 1A:
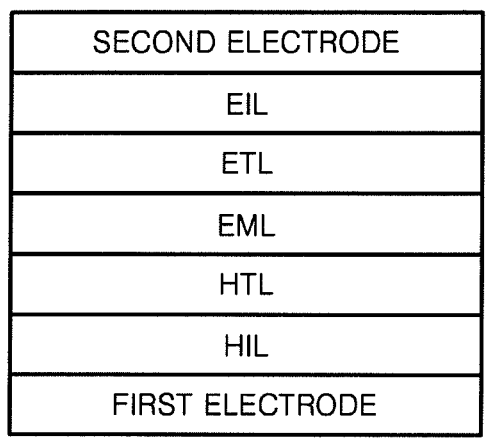
FIG. 1A schematically shows an organic light emitting device (OLED) according to an exemplary embodiment of the present invention.

DETAILED DESCRIPTION OF THE
EXEMPLARY EMBODIMENTS OF THE
INVENTION

Hereinafter, the present invention will now be described more fully with reference to the accompanying drawings, in which exemplary embodiments of the invention are shown.

An organic light emitting device (OLED) according to an exemplary embodiment of the present invention includes a substrate, a first electrode, a second electrode, and an organic layer interposed between the first electrode and the second electrode, wherein the organic layer includes a first layer having, for example, an organic-metal complex represented by Formula 1 below:

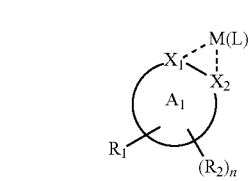

Formula 1 wherein $X_1$ and $X_2$ are, for example, an atom having an unshared electron pair which may form a coordinate covalent bond with an alkali metal M and may be nitrogen;

$A_1$ is, for example, a 5-membered, 8-membered, or 9-membered heteroaromatic ring system having at least three nitrogen atoms. The heteroaromatic ring system includes one or more than two rings, wherein one of the rings is a heteroaromatic ring or an aromatic ring, and more than two rings may be fused. The term "system" in the "heteroaromatic ring system" is used herein in order to indicate that the "heteroaromatic ring system" may include at least two rings.

In particular, $A_1$ may be derived from, for example, one of triazole, a ring represented by Formula 3 below, and benzotriazole:

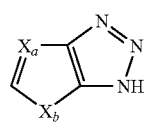

Formula 3 wherein $X_a$ and $X_b$ are each, for example, independently S, O, N, CH, or $CH_2$.

For example, $A_1$ may be derived from one of 1, 2, 4-triazole, 1, 2, 3-triazole, a compound of Formula 3 where $X_a$=CH and $X_b$=$CH_2$, a compound of Formula 3 where $X_a$=N and $X_b$=$CH_2$, a compound of Formula 3 where $X_a$=CH and $X_b$=NH, a compound of Formula 3 where $X_a$=CH and $X_b$=O, a compound of Formula 3 where $X_a$=N and $X_b$=O, and benzotriazole, but is not limited thereto.

The term "derived from" indicates that at least one element forming the ring of $A_1$ which may be, for example, triazole, a ring system represented by Formula 3, or benzotriazole may further form a coordinate covalent bond with M and form bonds with $R_1$ and $R_2$.

$A_1$ is, for example, a heteroaromatic ring system having at least three nitrogen atoms as described above. If $A_1$ has three or more nitrogen atoms, the number of nitrogen atoms having imine properties may increase, and thus the number of π-conjugated electron pair which can form a complex with a metal may increase. Thus, interaction between the metal and nitrogen atoms may increase. As the coordinate covalent bond between $A_1$ and M, which may be an alkali metal, may be strengthened, deterioration of an OLED including the first layer having an organic-metal complex represented by Formula 1 may be prevented, thereby preventing an increase in the driving voltage, decrease in brightness, and a decrease in lifetime.

$R_1$ in Formula 1 may be a group represented by, for example, —$(Y)_m$-$Q_1$.

Y, as a linking group, may be, for example, a substituted or unsubstituted $C_5$-$C_{30}$ arylene group or a substituted or unsubstituted $C_2$-$C_{30}$ heteroarylene group, and particularly a substituted or unsubstituted $C_5$-$C_{14}$ arylene group or a substituted or unsubstituted $C_2$-$C_{14}$ heteroarylene group. For example, Y may be one of a substituted or unsubstituted phenylene group, a substituted or unsubstituted naphthalene group, a substituted or unsubstituted anthracenylene group, a substituted or unsubstituted thiophenylene group, a substituted or unsubstituted furanylene group, a substituted or unsubstituted pyrolylene group, a substituted or unsubstituted pyridinylene group, and a substituted or unsubstituted pyrimidinylene group, but is not limited thereto. Y may have at least one substituent such as, for example, a halogen atom, a cyano group, a hydroxyl group, an amino group, a $C_1$-$C_{20}$ alkyl group, a $C_1$-$C_{20}$ alkoxy group, a $C_5$-$C_{30}$ aryl group, or a $C_2$-$C_{30}$ heteroaryl group, but the substituent is not limited thereto.

m is the number of Y's, and may be, for example, 0, 1, 2, or 3. If m is 2 or 3, a plurality of Ys may be the same or different.

For example, m may be 0 (that is, Y is a single bond), and —$(Y)_m$— may be one of the compounds represented by Formula 4 below, but is not limited thereto:

Formula 4

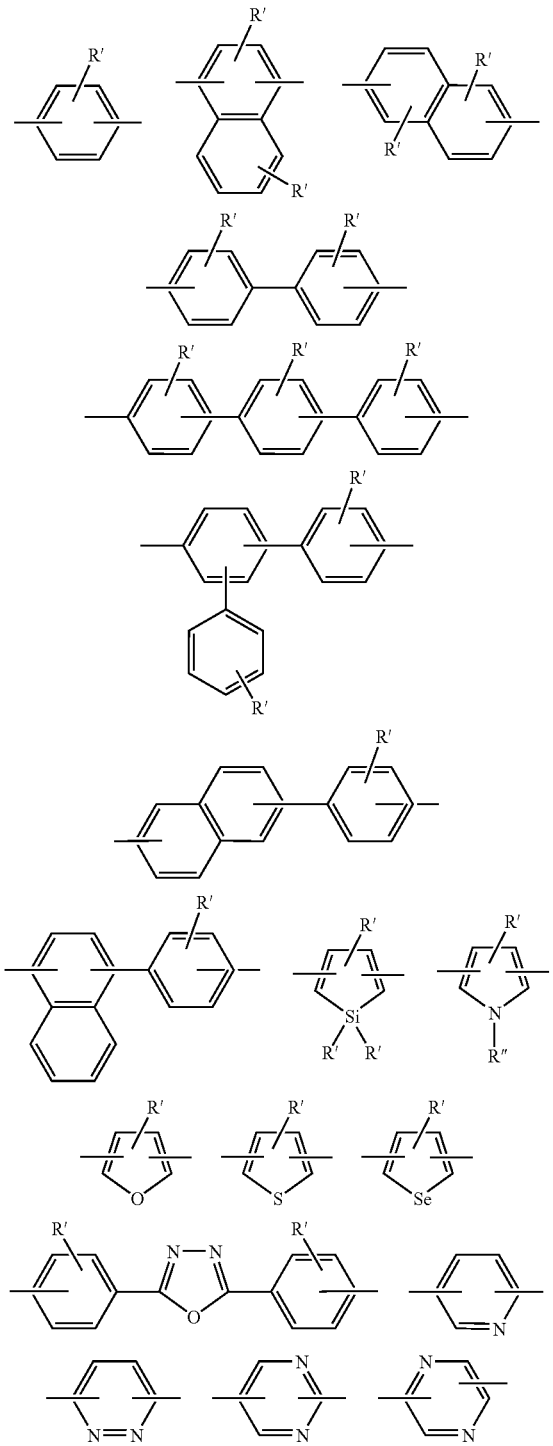

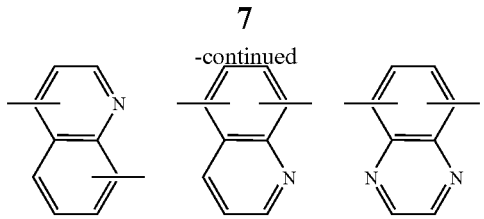

wherein R' may be a hydrogen atom, a halogen atom, a cyano group, a hydroxyl group, a $C_1$-$C_{20}$ alkyl group, a $C_1$-$C_{20}$ alkoxy group, a $C_5$-$C_{30}$ aryl group, or a $C_2$-$C_{30}$ heteroaryl group, but is not limited thereto. A plurality of R's in one of the compounds of Formula 4 may be the same or different.

$Q_1$ may be, for example, one of a substituted or unsubstituted $C_5$-$C_{30}$ arylene group or a substituted or unsubstituted $C_2$-$C_{30}$ heteroarylene group. For example, $Q_1$ may be one of a substituted or unsubstituted phenyl group, a substituted or unsubstituted pentalenyl group, a substituted or unsubstituted indenyl group, a substituted or unsubstituted naphthyl group, a substituted or unsubstituted anthracenyl group, a substituted or unsubstituted azulenyl group, a substituted or unsubstituted heptalenyl group, a substituted or unsubstituted acenaphthylenyl group, a substituted or unsubstituted phenalenyl group, a substituted or unsubstituted fluorenyl group, a substituted or unsubstituted anthraquinolyl group, a substituted or unsubstituted phenanthryl group, a substituted or unsubstituted triphenylenyl group, a substituted or unsubstituted pyrenyl group, a substituted or unsubstituted chrysenyl group, a substituted or unsubstituted picenyl group, a substituted or unsubstituted perylenyl group, a substituted or unsubstituted pentaphenyl group, a substituted or unsubstituted pentacenyl group, a substituted or unsubstituted tetraphenylenyl group, a substituted or unsubstituted hexaphenyl group, a substituted or unsubstituted hexacenyl group, a substituted or unsubstituted rubicenyl group, a substituted or unsubstituted coroneryl group, a substituted or unsubstituted heptaphenyl group, a substituted or unsubstituted heptacenyl group, a substituted or unsubstituted pyranthrenyl group, a substituted or unsubstituted ovalenyl group, a substituted or unsubstituted pyrazolyl group, a substituted or unsubstituted imidazolyl group, a substituted or unsubstituted oxazolyl group, a substituted or unsubstituted thiazolyl group, a substituted or unsubstituted triazolyl group, a substituted or unsubstituted tetrazolyl group, a substituted or unsubstituted oxadiazolyl group, a substituted or unsubstituted pyridinyl group, a substituted or unsubstituted pyridazinyl group, a substituted or unsubstituted pyrimidinyl group, a substituted or unsubstituted triazynyl group, a substituted or unsubstituted carbazolyl group, a substituted or unsubstituted indolyl group, a substituted or unsubstituted quinolinyl group, and a substituted or unsubstituted isoquinolinyl group, but is not limited thereto. Here, $Q_1$ may have at least one substituent such as, for example, a halogen atom, a cyano group, a hydroxyl group, an amino group, a $C_1$-$C_{20}$ alkyl group, a $C_1$-$C_{20}$ alkoxy group, a $C_5$-$C_{30}$ aryl group, or a $C_2$-$C_{30}$ heteroaryl group, but is not limited thereto.

In Formula 1, $R_2$ is a substituent of $A_1$ and may be, for example, a halogen atom, a cyano group, a hydroxyl group, an amino group, a substituted or unsubstituted $C_1$-$C_{20}$ alkyl group, a substituted or unsubstituted $C_1$-$C_{20}$ alkoxy group, a substituted or unsubstituted $C_5$-$C_{30}$ cycloalkyl group, a substituted or unsubstituted $C_2$-$C_{30}$ heterocycloalkyl group, a substituted or unsubstituted $C_5$-$C_{30}$ aryl group, or a substituted or unsubstituted $C_2$-$C_{30}$ heteroaryl group, and particularly a halogen atom, a cyano group, a hydroxyl group, an amino group, a substituted or unsubstituted $C_1$-$C_{10}$ alkyl group, a substituted or unsubstituted $C_5$-$C_{14}$ aryl group, or a substituted or unsubstituted $C_2$-$C_{14}$ heteroaryl group.

n is the number of $R_2$'s and may be, for example, 0, 1, 2, or 3 according to the structure of $A_1$. If the n is equal to or greater than 2, the plurality of $R_2$'s may be the same or different.

For example, $R_2$ may be one of the compounds represented by Formulae 5a to 5j below;

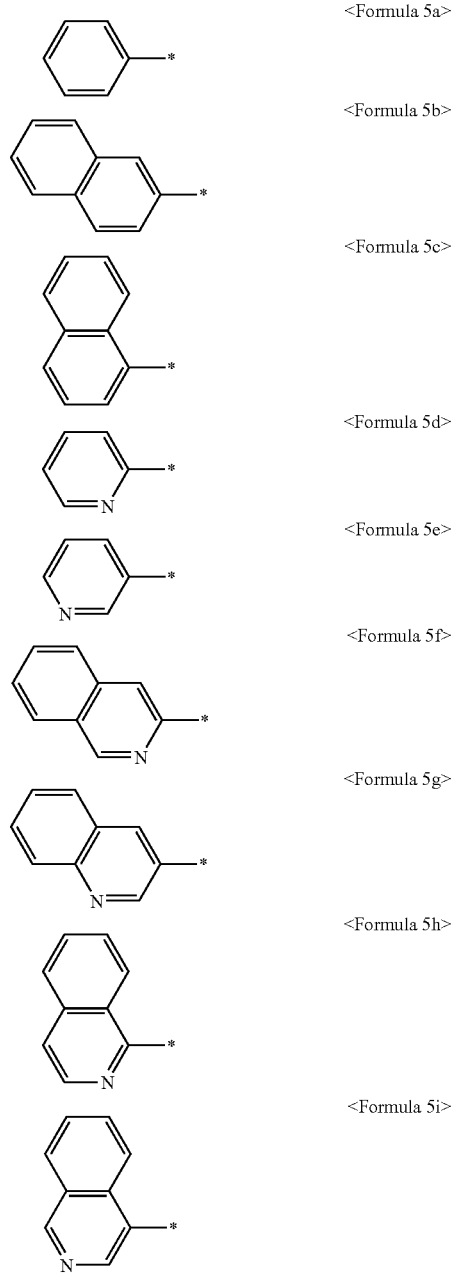

wherein * is a binding site with $A_1$.

Meanwhile, in Formula 1, M is an alkali metal such as, for example, lithium (Li), sodium (Na), potassium (K), rubidium (Rb), cesium (Cs), or francium (Fr), and preferably be Li or Na.

In Formula 1, L is an organic ligand bound with M and may be represented by, for example, one of Formulae 2a to 2c below.

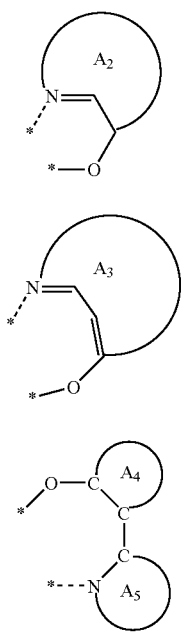

Formula 2a

Formula 2b

Formula 2c

In Formulae 2a, 2b, and 2c, $A_2$, $A_3$, and $A_5$ may, for example, be each independently a substituted or unsubstituted $C_2$-$C_{30}$ heteroaromatic ring having at least one nitrogen atom. In more detail, $A_2$, $A_3$, and $A_5$ may be each independently one of pyrrole, imidazole, pyrazole, isothiazole, isoxazole, pyridine, pyrazine, pyrimidine, pyridazine, isoindole, indole, indazole, purine, quinoline, phthalazine, naphthyridine, quinoxaline, quinazoline, cinnoline, carbazole, phenanthridine, acridine, perimidine, phenanthroline, phenazine, phenothiazine, phenoxazine, benzothiazole, benzooxazole, benzoimidazole, and benzoquinoline, but are not limited thereto.

In Formulae 2a, 2b, and 2c, $A_4$ may be, for example, a substituted or unsubstituted $C_5$-$C_{30}$ aromatic ring or a substituted or unsubstituted $C_2$-$C_{30}$ heteroaromatic ring. In more detail, $A_4$ may be one of benzene, pentalene, indene, naphthalene, azulene, heptalene, biphenylene, indacene, acenaphthylene, fluorene, phenalene, phenanthrene, anthracene, fluoranthene, triphenylene, pyrene, chrysene, naphthacene, picene, petylene, pentaphene, and hecacene, but is not limited thereto.

$A_2$ may be quinoline, $A_3$ may be benzoquinoline, $A_4$ may be benzene, or $A_5$ may be benzothiazole or benzooxazole, but they are not limited thereto.

In Formulae 2a, 2b, and 2c, * is a binding site with M.

In particular, L may be one of the compounds represented by Formulae 6a to 6d below, but is not limited thereto.

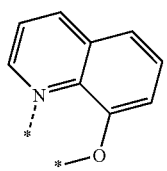

<Formula 6a>

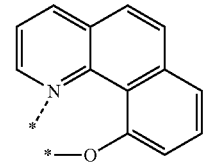

<Formula 6b>

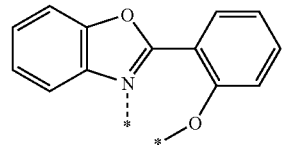

<Formula 6c>

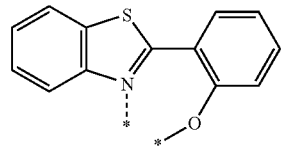

<Formula 6d>

In Formulae 6a to 6d, * is a binding site with M.

The first layer including the organic-metal complex represented by Formula 1 as described above may be, for example, an ETL, an EIL, or a HBL.

The unsubstituted $C_1$-$C_{20}$ alkyl group may be, for example, a methyl group, an ethyl group, a propyl group, an isobutyl group, a sec-butyl group, a pentyl group, an iso-amyl group, or a hexyl group, and at least one hydrogen atom in the $C_1$-$C_{20}$ alkyl group may be substituted with a halogen atom, a hydroxy group, a nitro group, a cyano group, an amino group, an amidino group, hydrazine, hydrazone, a carboxyl group or a salt thereof, a sulfonic acid group or a salt thereof, a phosphoric acid group or a salt thereof, a $C_1$-$C_{30}$ alkyl group, a $C_1$-$C_{30}$ alkoxy group, a $C_1$-$C_{30}$ alkenyl group, a $C_1$-$C_{30}$ alkynyl group, a $C_6$-$C_{30}$ aryl group, or a $C_2$-$C_{20}$ heteroaryl group.

The unsubstituted $C_1$-$C_{20}$ alkoxy group may be, for example, a methoxy group, an ethoxy group, a phenyloxy group, a cyclohexyloxy group, a naphthyloxy group, isophopyloxy group, or a diphenyloxy group, and at least one of the hydrogen atoms in the $C_1$-$C_{20}$ alkoxy group may be substituted with any of the substituents described in the unsubstituted $C_1$-$C_{20}$ alkyl group.

The unsubstituted $C_5$-$C_{30}$ aryl group is, for example, a carbocyclic aromatic system having 5 to 30 carbon atoms including at least one aromatic ring. If the $C_5$-$C_{30}$ aryl group includes at least two aromatic rings, the rings may be fused to each other or bonded to each other through a single bond. At least one of the hydrogen atoms in the $C_5$-$C_{30}$ aryl group may be substituted with, for example, any of the substituents described in the unsubstituted $C_1$-$C_{20}$ alkyl group.

The substituted or unsubstituted $C_5$-$C_{30}$ aryl group may be, for example, a phenyl group, a $C_1$-$C_{10}$ alkylphenyl group (e.g., an ethylphenyl group), a halophenyl group (e.g., an o-, m- and p-fluorophenyl group and dichlorophenyl group), a cyanophenyl group, a dicyanophenyl group, a trifluoromethoxyphenyl group, a biphenyl group, a halobiphenyl group, a cyanobiphenyl group, a $C_1$-$C_{10}$ biphenyl group, a $C_1$-$C_{10}$ alkoxybiphenyl group, an o-, m- and p-tolyl group, an o-, m- and p-cumenyl group, a mesityl group, a phenoxyphenyl group, a (α,α-dimethylbenzen)phenyl group, a (N,N'-dimethyl)aminophenyl group, a (N,N'-diphenyl)aminophenyl group, a pentalenyl group, an indenyl group, a naphthyl group, a halonaphthyl group (e.g., a fluoronaphthyl group), a $C_1$-$C_{10}$ alkylnaphthyl group (e.g., a methylnaphthyl group), a $C_1$-$C_{10}$ alkoxynaphthyl group (e.g., a methoxynaphthyl group), a cyanonaphthyl group, an anthracenyl group, or an azulenyl group. At least one of the hydrogen atoms in the $C_5$-$C_{30}$ aryl group may be substituted with, for example, any of the substituents described in the unsubstituted $C_1$-$C_{20}$ alkyl group.

The unsubstituted $C_5$-$C_{30}$ arylene group is, for example, a bivalent linking group having a similar structure to the aryl group, and examples of the $C_5$-$C_{30}$ arylene group are a phenylene group and a naphthalene group, but are not limited thereto. At least one of the hydrogen atoms in the $C_5$-$C_{30}$ arylene group may be substituted with, for example, any of the substituents described in the unsubstituted $C_1$-$C_{20}$ alkyl group.

The unsubstituted $C_2$-$C_{30}$ heteroaryl group is a system having at least one aromatic ring which includes, for example, carbon atoms and at least one hetero atom of nitrogen (N), oxygen (O), phosphorous (P) and sulfur (S). The aromatic ring may be fused to each other or bonded to each other through a single bond. At least one of the hydrogen atoms in the $C_2$-$C_{30}$ heteroaryl group may be substituted with, for example, any of the substituents described in the unsubstituted $C_1$-$C_{20}$ alkyl group.

The unsubstituted $C_2$-$C_{30}$ heteroaryl group may be, for example, a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazolyl group, an indolyl group, a quinolinyl group, and an isoquinolinyl group. At least one of the hydrogen atoms in the $C_2$-$C_{30}$ heteroaryl group may be substituted with, for example, any of the substituents described in the unsubstituted $C_1$-$C_{20}$ alkyl group.

The unsubstituted $C_5$-$C_{30}$ cycloalkyl group is, for example, an alkyl group having a ring system, and the unsubstituted $C_5$-$C_{30}$ heterocycloalkyl group is a $C_5$-$C_{30}$ cycloalkyl group in which one of carbon atoms is substituted with one of hetero atoms of N, O, P, and S. At least one of the hydrogen atoms in the $C_5$-$C_{30}$ cycloalkyl group and $C_5$-$C_{30}$ heterocycloalkyl group may be, for example, substituted with any of the substituents described in the unsubstituted $C_1$-$C_{20}$ alkyl group.

The unsubstituted $C_5$-$C_{30}$ aromatic ring is, for example, a carbocyclic aromatic system having 5 to 30 carbon atoms and including at least one aromatic ring. If the $C_5$-$C_{30}$ aromatic ring includes at least two rings, the rings may be fused to each other or bonded to each other through a single bond. The term "$C_5$-$C_{30}$ aromatic ring" is used to emphasize structural characteristics of the formula compared to the term "$C_5$-$C_{30}$ aryl group" which is used based on a radical. The unsubstituted $C_2$-$C_{30}$ heteroaromatic ring may also be understood similarly. The $C_5$-$C_{30}$ aromatic ring (or aromatic ring) and the $C_2$-$C_{30}$ heteroaromatic ring (heteroaromatic ring) may be obvious to those of ordinary skill in the art in response to Formulae 1, 2a, 2b, 2c, and 2d. At least one of the hydrogen atoms in the $C_5$-$C_{30}$ aromatic ring or $C_5$-$C_{30}$ heteroaromatic ring may be substituted with, for example, any of the substituents described in the unsubstituted $C_1$-$C_{20}$ alkyl group.

Examples of the organic-metal complex represented by Formula 1 are as follows, but are not limited thereto:

M(quinolato)(4-[4-(9,10-di-phenyl-2-yl-anthracene-2-yl)-phenyl]-3,5-diphenyl-4H-[1,2,4]triazole),
M(quinolato)(3,5-diphenyl-4-[4-(6-phenyl-anthracene-2-yl)-phenyl]-4H-[1,2,4]triazole),
M(quinolato)(4-[4-(9,10-di-naphthalene-2-yl-anthracene-2-yl)-phenyl]-3,5-diphenyl-4H-[1,2,4]triazole),
M(quinolato)(4-[5-(9,10-di-naphthalene-2-yl-anthracene-2-yl)-thiophene-2-yl]-3,5-diphenyl-4H-[1,2,4]triazole),
M(quinolato)(4-[5-(9,10-di-naphthalene-2-yl-anthracene-2-yl)-furan-2-yl]-3,5-diphenyl-4H-[1,2,4]triazole),
M(quinolato)(4-[5-(9,10-di-naphthalene-2-yl-anthracene-2-yl)-pyrrole-2-yl]-3,5-diphenyl-4H-[1,2,4]triazole),
M(quinolato)(4-[4-(9,10-diphenyl-anthracene-2-yl)-phenyl]-3,5-di-naphthalene-2-yl-4H-[1,2,4]triazole),
M(quinolato)(4-[4-(9,10-di-naphthalene-2-yl-anthracene-2-yl)-phenyl]-3,5-di-naphthalene-2-yl-4H-[1,2,4]triazole),
M(quinolato)(4-[4-(9,10-di-naphthalene-anthracene-2-yl)-phenyl]-3,5-di-naphthalene-1-yl-4H-[1,2,4]triazole),
M(quinolato)(4-[4-(9,10-di-naphthalene-anthracene-2-yl)-phenyl]-3,5-di-naphthalene-1-yl-4H-[1,2,4]triazole),
M(quinolato)(2-(9,10-di-naphthalene-2-yl-anthracene-2-yl)-5-(3,5-diphenyl-[1,2,4]triazole-4-yl)-pyridine),
M(quinolato)(3-(9,10-di-naphthalene-2-yl-anthracene-2-yl)-6-(3,5-diphenyl-[1,2,4]triazole-4-yl)-pyridine),
M(quinolato)(5-(9,10-di-naphthalene-2-yl-anthracene-2-yl)-2-(3,5-diphenyl-[1,2,4]triazole-4-yl)-pyrimidine),
M(quinolato)(3-[4-(9,10-di-phenyl-2-yl-anthracene-2-yl)-phenyl]-4,5-diphenyl-4H-[1,2,4]triazole),
M(quinolato)(4,5-diphenyl-4-[4-(6-phenyl-anthracene-2-yl)-phenyl]-4H-[1,2,4]triazole),
M(quinolato)(3-[4-(9,10-di-naphthalene-2-yl-anthracene-2-yl)-phenyl]-4,5-diphenyl-4H-[1,2,4]triazole),
M(quinolato)(3-[5-(9,10-di-naphthalene-2-yl-anthracene-2-yl)-thiophene-2-yl]-4,5-diphenyl-4H-[1,2,4]triazole),
M(quinolato)(3-[5-(9,10-di-naphthalene-2-yl-anthracene-2-yl)-furan-2-yl]-4,5-diphenyl-4H-[1,2,4]triazole),
M(quinolato)(3-[5-(9,10-di-naphthalene-2-yl-anthracene-2-yl)-pyrrole-2-yl]-4,5-diphenyl-4H-[1,2,4]triazole),
M(quinolato)(3-[4-(9,10-diphenyl-anthracene-2-yl)-phenyl]-4,5-di-naphthalene-2-yl-4H-[1,2,4]triazole),
M(quinolato)(3-[4-(9,10-di-naphthalene-2-yl-anthracene-2-yl)-phenyl]-4,5-di-naphthalene-2-yl-4H-[1,2,4]triazole),
M(quinolato)(3-[4-(9,10-di-naphthalene-anthracene-2-yl)-phenyl]-4,5-di-naphthalene-1-yl-4H-[1,2,4]triazole),
M(quinolato)(3-[4-(9,10-di-naphthalene-anthracene-2-yl)-phenyl]-4,5-di-naphthalene-1-yl-4H-[1,2,4]triazole),
M(quinolato)(2-(9,10-di-naphthalene-2-yl-anthracene-2-yl)-5-(4,5-diphenyl-[1,2,4]triazole-3-yl)-pyridine),
M(quinolato)(3-(9,10-di-naphthalene-2-yl-anthracene-2-yl)-6-(4,5-diphenyl-[1,2,4]triazole-3-yl)-pyridine),
M(quinolato)(5-(9,10-di-naphthalene-2-yl-anthracene-2-yl)-2-(4,5-diphenyl-[1,2,4 ]triazole-3-yl)-pyrimidine),
M(quinolato)(4-[4-(4,9-diphenyl-pyrene-2-yl)-phenyl]-3,5-diphenyl-4H-[1,2,4]triazole),
M(quinolato)(4-[4-(4,9-diphenyl-pyrene-2-yl)-phenyl]-3,5-diphenyl-4H-[1,2,4]triazole),
M(quinolato)(3,5-diphenyl-4-[4-(6-phenyl-pyrene-2-yl)-phenyl]-4H-[1,2,4]triazole),
M(quinolato)(4-[4-(9,10-di-naphthalene-2-yl-pyrene-2-yl)-phenyl]-3,5-diphenyl-4H-[1,2,4]triazole),
M(quinolato)(4-[5-(9,10-di-naphthalene-2-yl-pyrene-2-yl)-thiophene-2-yl]-3,5-diphenyl-4H-[1,2,4]triazole),
M(quinolato)(4-[5-(9,10-di-naphthalene-2-yl-pyrene-2-yl)-furan-2-yl]-3,5-diphenyl-4H-[1,2,4]triazole),
M(quinolato)(4-[5-(9,10-di-naphthalene-2-yl-pyrene-2-yl)-pyrrole-2-yl]-3,5-diphenyl-4H-[1,2,4]triazole),
M(quinolato)(4-[4-(9,10-diphenyl-pyrene-2-yl)-phenyl]-3,5-di-naphthalene-2-yl-4H-[1,2,4]triazole),
M(quinolato)(4-[4-(9,10-di-naphthalene-2-yl-pyrene-2-yl)-phenyl]-3,5-di-naphthalene-2-yl-4H-[1,2,4]triazole),
M(quinolato)(4-[4-(9,10-di-naphthalene-pyrene-2-yl)-phenyl]-3,5-di-naphthalene-1-yl-4H-[1,2,4]triazole),
M(quinolato)(4-[4-(9,10-di-naphthalene-pyrene-2-yl)-phenyl]-3,5-di-naphthalene-1-yl-4H-[1,2,4]triazole), M(quinolato)(2-(9,10-di-naphthalene-2-yl-pyrene-2-yl)-5-(3,5-diphenyl-[1,2,4]triazole-4-yl)-pyridine),
M(quinolato)(3-(9,10-di-naphthalene-2-yl-pyrene-2-yl)-6-(3,5-diphenyl-[1,2,4]triazole-4-yl)-pyridine),
M(quinolato)(5-(9,10-di-naphthalene-2-yl-pyrene-2-yl)-2-(3,5-diphenyl-[1,2,4]triazole-4-yl)-pyrimidine),
M(quinolato)(3-[4-(9,10-di-phenyl-2-yl-pyrene-2-yl)-phenyl]-4,5-diphenyl-4H-[1,2,4]triazole),
M(quinolato)(4,5-diphenyl-4-[4-(6-phenyl-pyrene-2-yl)-phenyl]-4H-[1,2,4]triazole),
M(quinolato)(3-[4-(9,10-di-naphthalene-2-yl-pyrene-2-yl)-phenyl]-4,5-diphenyl-4H-[1,2,4]triazole),
M(quinolato)(3-[5-(9,10-di-naphthalene-2-yl-pyrene-2-yl)-thiophene-2-yl]-4,5-diphenyl-4H-[1,2,4]triazole),
M(quinolato)(3-[5-(9,10-di-naphthalene-2-yl-pyrene-2-yl)-furan-2-yl]-4,5-diphenyl-4H-[1,2,4]triazole),
M(quinolato)(3-[5-(9,10-di-naphthalene-2-yl-pyrene-2-yl)-pyrrole-2-yl]-4,5-diphenyl-4H-[1,2,4]triazole),
M(quinolato)(3-[4-(9,10-diphenyl-pyrene-2-yl)-phenyl]-4,5-di-naphthalene-2-yl-4H-[1,2,4]triazole),
M(quinolato)(3-[4-(9,10-di-naphthalene-2-yl-pyrene-2-yl)-phenyl]-4,5-di-naphthalene-2-yl-4H-[1,2,4]triazole),
M(quinolato)(3-[4-(9,10-di-naphthalene-pyrene-2-yl)-phenyl]-4,5-di-naphthalene-1-yl-4H-[1,2,4]triazole),
M(quinolato)(3-[4-(9,10-di-naphthalene-pyrene-2-yl)-phenyl]-4,5-di-naphthalene-1-yl-[1,2,4]triazole),
M(quinolato)(2-(9,10-di-naphthalene-2-yl-pyrene-2-yl)-5-(4,5-diphenyl-[1,2,4]triazole-3-yl)-pyridine),
M(quinolato)(3-(9,10-di-naphthalene-2-yl-pyrene-2-yl)-6-(4,5-diphenyl-[1,2,4]triazole-3-yl)-pyridine), and
M(quinolato)(5-(9,10-di-naphthalene-2-yl-pyrene-2-yl)-2-(4,5-diphenyl-[1,2,4]triazole-3-yl)-pyrimidine).

In these examples, "M" may be, for example, Li or Na.

A method of preparing an OLED according to an exemplary embodiment of the present invention includes: forming a first electrode on a substrate; forming an organic layer including a first layer including an organic-metal complex represented by Formula 1 on the first electrode; and forming a second electrode on the organic layer. Formula 1 is described above, and will not be described herein.

The first layer may be formed by co-depositing compounds represented by, for example, Formulae 7 and 8 below.

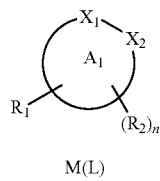

Formula 7

M(L)

Formula 8

X₁, X₂, R₁, R₂, n, and A₁ of Formula 7 and M and L of Formula 8 are as described above with reference to Formula 1.

The compounds of Formulae 7 and 8 do not form a simple mixture having two phases different from each other in the first layer formed by co-depositing the compositions of Formulae 7 and 8, but form a compound represented by Formula 1 via a coordinate covalent bond between an element of A₁ and M.

The OLED according to an exemplary embodiment of the present invention may have various structures. That is, at least one layer selected from the group consisting of, for example, a HIL, a HTL, a HBL, an electron blocking layer (EBL), an ETL, and an EIL may be interposed between the first electrode and the second electrode.

Figure 1B:
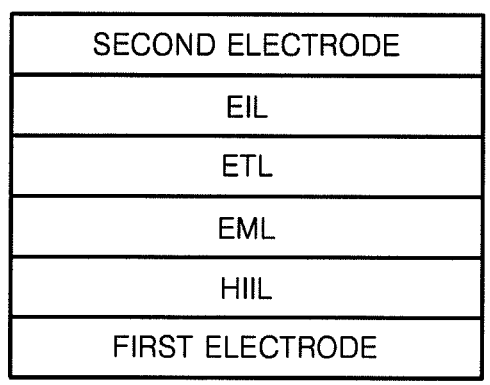
FIG. 1B schematically shows an OLED according to an exemplary embodiment of the present invention.

More particularly, examples of the OLED are shown in FIGS. 1A and 1B. The OLED of FIG. 1A has a first electrode/HIL/HTL/EML/ETL/EIL/second electrode structure, and the OLED of FIG. 1B has a first electrode/HIL/EML/ETL/EIL/second electrode structure.

Hereinafter, a method of preparing an OLED according to an exemplary embodiment of the present invention will be descried with reference to FIG. 1A.

First, the first electrode is formed by, for example, depositing or sputtering a high work-function material that is used to form the first electrode on a substrate. The first electrode may be, for example, an anode. The substrate, which may be any substrate that is used in conventional OLEDs, may be, for example, a glass substrate or a transparent plastic substrate with beneficial mechanical strength, thermal stability, transparency, surface smoothness, ease of handling, and waterproof properties. The material that is used to form the first electrode may be, for example, indium tin oxide (ITO), indium zinc oxide (IZO), Tin Oxide ($SnO_2$), zinc oxide (ZnO), or the like which is transparent and has high conductivity.

Then, a HIL may be formed on the first electrode using, for example, vacuum deposition, spin coating, casting, Langmuir Blodgett (LB) deposition, or the like.

When the HIL is formed using vacuum deposition, the deposition conditions may vary according to a compound that is used to form the HIL, and the structure and thermal properties of the HIL to be formed. In general, however, conditions for vacuum deposition may include, for example, a deposition temperature of about 100 to about 500° C., a pressure of about $10^{-8}$ to about $10^{-3}$ torr, and a deposition velocity of about 0.01 to about 100 Å/sec.

When the HIL is formed using spin coating, the coating conditions may vary according to a compound that is used to form the HIL, and the structure and thermal properties of the HIL to be formed. In general, however, the coating velocity may be in the range of, for example, about 2000 to about 5000 rpm, and a temperature for heat treatment which is performed to remove a solvent after coating may be in the range of, for example, about 80 to about 200° C.

The thickness of the HIL may be in the range of, for example, about 100 to about 10000 Å, and preferably, in the range of about 100 to about 1000 Å. When the thickness of the HIL is within the ranges described above, beneficial hole injecting capabilities may be obtained without a substantial increase in the driving voltage.

A material that is used to form the HIL may be any material that is known in the art, for example, a phthalocyanine compound, or a star-burst type amine derivative such as 4,4',4"-tris(carbazole-9-yl)-triphenyl amine (TCTA) and MTDATA, a soluble and conductive polymer such as polyaniline/dodecylbenzenesulfonic acid (Pani/DBSA); poly(3,4-ethylenedioxythiophene)/poly(4-styrenesulfonate) (PEDOT/PSS): polyaniline/camphor sulfonic acid (Pani/CSA); (polyaniline)/poly(4-styrenesulfonate) (PANI/PSS); or the like.

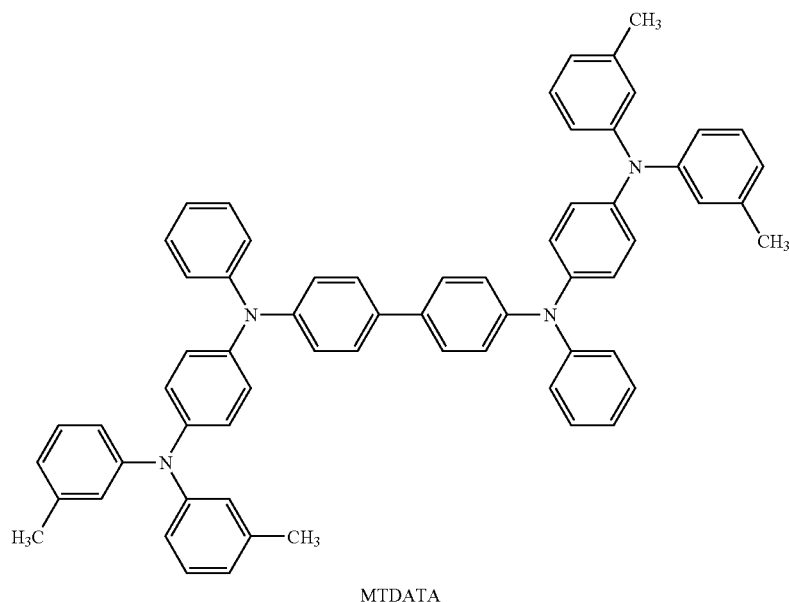 [SMILES: Cc1cccc(N(c2ccc(N(c3ccccc3)c3ccc(-c4ccc(N(c5ccccc5)c5ccc(N(c6cccc(C)c6)c6cccc(C)c6)cc5)cc4)cc3)cc2)c2cccc(C)c2)c1]

MTDATA

Then, a HTL may be formed on the HIL using, for example, vacuum deposition, spin coating, casting, LB deposition, or the like. When the HTL is formed using vacuum deposition or spin coating, deposition and coating conditions are similar to those for formation of the HIL, although the deposition and coating conditions may vary according to a compound that is used to form the HTL.

The thickness of the HTL may be in the range of, for example, about 50 to about 1000 Å, and preferably, in the range of about 100 to about 600 Å. When the thickness of the HTL is within the ranges described above, beneficial hole transporting capabilities may be obtained without a substantial increase in the driving voltage.

A material that is used to form the HTL may be any material that is known in the art, for example, a carbazole derivative such as N-phenylcarbazole, polyvinylcarbazole, or the like; or a conventional amine derivative having an aromatic condensation ring, such as N,N'-bis(3-methylphenyl)-N,N'-diphenyl-[1,1-biphenyl]-4,4'-diamine (TPD), N,N'-di(naphthalene-1-yl)-N,N'-diphenyl benzydine (α-NPD), and Compound 1 below.

Then, an EML may be formed on the HTL using, for example, vacuum deposition, spin coating, casting, LB, or the like. When the EML is formed using vacuum deposition or spin coating, deposition and coating conditions are similar to those for formation of the HIL, although the deposition and coating conditions may vary according to a compound that is used to form the EML.

The thickness of the EML may be in the range of, for example, about 100 to about 1000 Å, and preferably in the range of about 200 to about 600 Å. When the thickness of the EML is within the ranges described above, beneficial light emitting capabilities may be obtained without a substantial increase in the driving voltage.

The EML may include a single material, and may also include both of a host material and a dopant material that are known in the art. The host material may be tris(8-quinolinorate)aluminum ($Alq_3$), 4,4'-N,N'-dicarbazole-biphenyl (CBP), poly(n-vinylcarbazole) (PVK), 9,10-di(naphthalene-2-yl)anthracene (ADN), or Compound 2 below, but is not limited thereto.

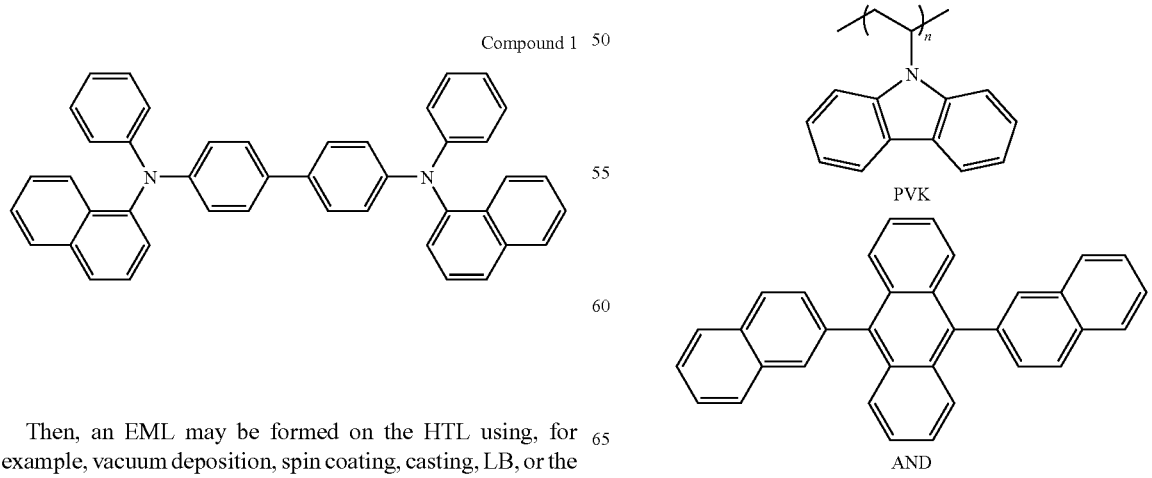

Compound 1

PVK

AND

-continued

Compound 2

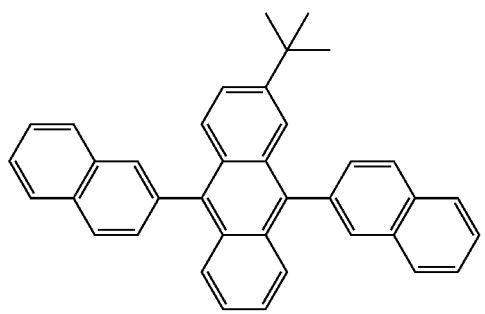

Meanwhile, a known red dopant may be PtOEP, Ir(piq)₃, Btp₂Ir(acac), DCJTB, or the like, but is not limited thereto.

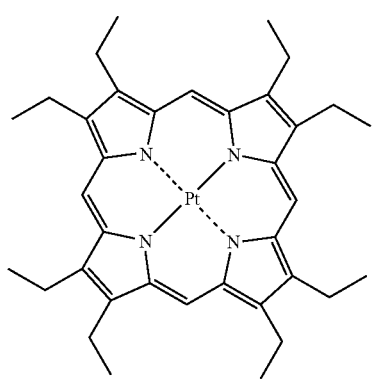

PtOEP

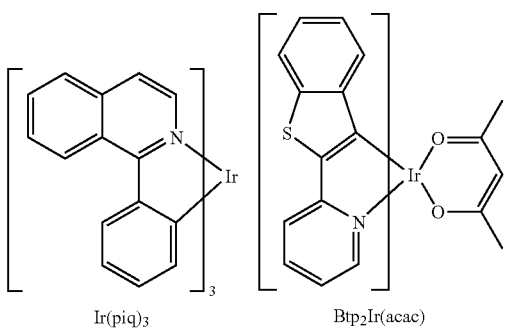

Ir(piq)₃     Btp₂Ir(acac)

In addition, a known green dopant may be Ir(ppy)₃ (ppy=phenylpyridine), Ir(ppy)₂(acac), Ir(mpyp)₃, C545T, or the like, but is not limited thereto.

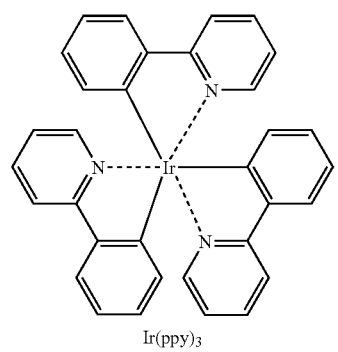

Ir(ppy)₃

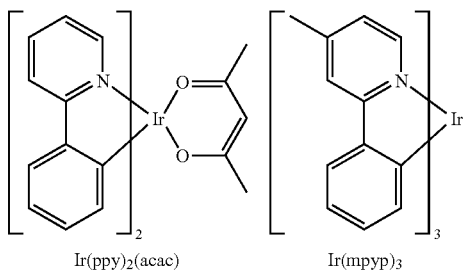

Ir(ppy)₂(acac)     Ir(mpyp)₃

Meanwhile, a known blue dopant may be F₂Irpic, (F₂ppy)₂Ir(tmd), Ir(dfppz)₃, ter-fluorene, 4,4'-bis(4-diphenyl amiostyryl)biphenyl (DPAVBi), 2,5,8,11-tetra-tert-butyl perylene (TBP), Compound 3 below, or the like, but is not limited thereto.

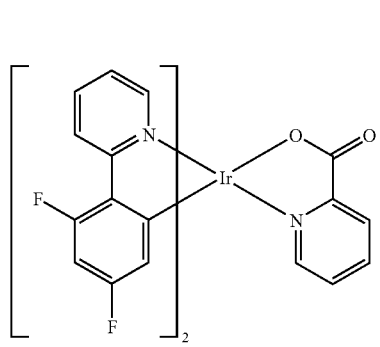
F₂Irpic
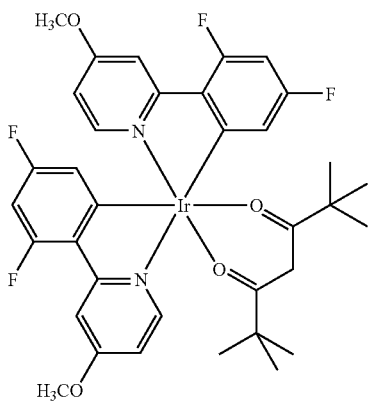
(F₂ppy)₂Ir(tmd)
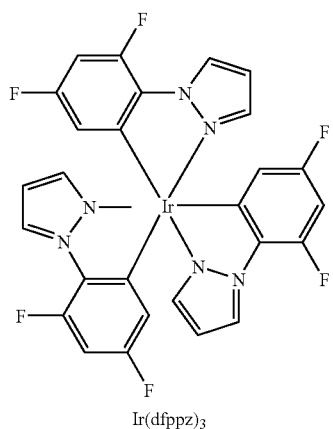
Ir(dfppz)₃
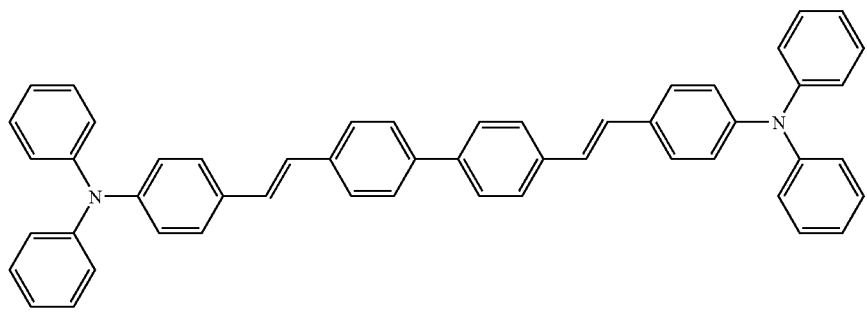
DPAVBi
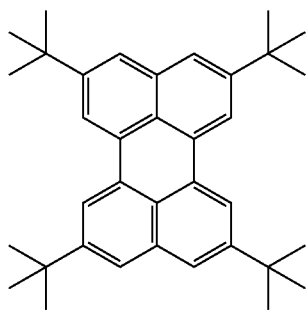
TBP -continued Compound 3

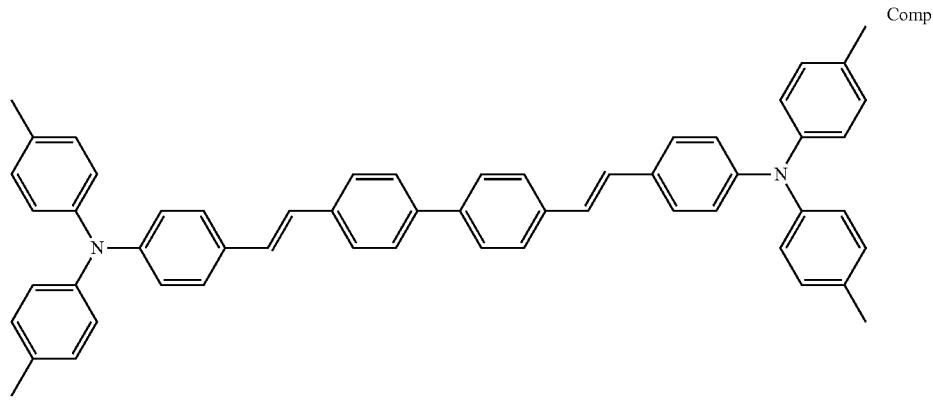

When the dopant and the host are used, the doping concentration is not limited, but the amount of the dopant is typically about 0.01 to about 15 parts by weight based on about 100 parts by weight of the host.

When the EML includes a phosphorescent dopant, a HBL may be formed on the EML using, for example, vacuum deposition, spin coating, casting, LB deposition, or the like in order to prevent diffusion of triplet excitons or holes into an ETL. When the HBL is formed using vacuum deposition or spin coating, deposition and coating conditions are similar to those for formation of the HIL, although the deposition and coating conditions may vary according to a compound that is used to form the HBL. A material that is used to form the HBL may be, for example, an oxadiazole derivative, a phenanthroline derivative, or the like that are known in the art.

Phenanthroline derivative

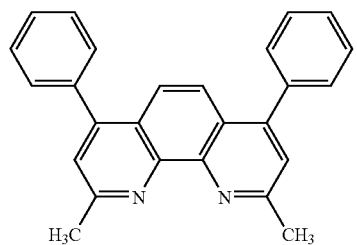 [SMILES: Cc1cc(-c2ccccc2)c2ccc3c(-c4ccccc4)cc(C)nc3c2n1]

The thickness of the HBL is in the range of, for example, about 50 to about 1000 Å, and preferably 100 to 300 Å. When the thickness of the HBL is within the ranges described above, beneficial hole blocking capabilities may be obtained without substantial increase of driving voltage.

Then, an ETL may be formed on the EML or HBL using, for example, vacuum deposition, spin coating, casting, or the like. When the ETL is formed using vacuum deposition or spin coating, deposition and coating conditions are similar to those for formation of the HIL, although the deposition and coating conditions may vary according to a compound that is used to form the ETL. A material that is used to form the ETL may be, for example, a material stably transporting electrons injected from the electron injecting electrode (cathode) and may be the compound represented by Formula 1 as described above. In this regard, the compound of Formula 1 may be, for example, directly deposited, coated, or thermally transferred, or compounds represented by Formulae 7 and 8 may be co-deposited.

The thickness of the ETL may be in the range of, for example, about 100 to about 1000 Å, and preferably in the range of about 200 to about 500 Å. When the thickness of the ETL is within the ranges described above, beneficial electron transporting capabilities may be obtained without a substantial increase in the driving voltage.

Then, an EIL which is formed of a material allowing relatively easy injection of electrons from a cathode may be formed on the ETL, and materials that is used to form the EIL are not limited.

The material that is used to form the EIL may be, for example, lithium fluoride (LiF), sodium chloride (NaCl), cesium fluoride (CsF), lithium oxide ($Li_2O$), barium oxide (BaO), or the like, which is known in the art. Deposition and coating conditions are similar to those for formation of the HIL, although the deposition and coating may vary according to a material that is used to form the EIL.

The thickness of the EIL may be in the range of, for example, about 1 to about 100 Å, and preferably in the range of about 5 to about 50 Å. When the thickness of the EIL is less than 1 Å, an electron injecting capability may be decreased. On the other hand, when the thickness of the EIL is greater than about 100 Å, driving voltage may be increased.

Finally, the second electrode may be formed on the EIL by, for example, vacuum deposition, sputtering, or the like. The second electrode may be used as, for example, a cathode. A metal that is used to form the second electrode may be, for example, a low work-function metal, alloy, electrically conductive compound, or a combination thereof. For example, the metal that is used to form the second electrode may be lithium (Li), magnesium (Mg), aluminum (Al), Al—Li, calcium (Ca), magnesium-indium (Mg—In), magnesium-silver (Mg—Ag), or the like. In addition, a transparent cathode formed of, for example, ITO or IZO may be used to produce a front surface light emitting device.

Hereinafter, the present invention will be described in greater detail with reference to the following examples. The following examples are for illustrative purposes only and are not intended to limit the scope of the exemplary embodiments of the invention.

EXAMPLES

Example 1

A 15 ω/$cm^2$ (about 1000 Å) ITO glass substrate was cut into pieces of about 50 mm×about 50 mm×about 0.7 mm in size, ultrasonic washed with acetone isopropyl alcohol for about 15 minutes, ultrasonic washed with deionized water for about 5 minutes, and washed with UV ozone for about 30 minutes to prepare an anode. Then, MTDATA was vacuum deposited on the substrate to form a HIL with a thickness of about 600 Å, Compound 1 was vacuum deposited on the HIL to form a HTL with a thickness of about 300 Å, and Compound 2 and Compound 3 were vacuum deposited on the HTL at a weight ratio of about 100:5 to form an EML with a thickness of about 300 Å. Then, 4-[4-(9,10-di-naphthalene-2-yl-anthracene-2-yl)-phenyl]-3,5-diphenyl-4H-[1,2,4]triazole and lithium quinolate (LiQ) were co-deposited on the EML to form an ETL with a thickness of about 250 Å. Then, LiF was vacuum deposited on the ETL to form an EIL with a thickness of about 6 Å, and Al was vacuum deposited on the EIL to a thickness of about 1500 Å to form a cathode to complete manufacture of an OLED shown in FIG. 1A.

Example 2

An OLED was prepared in the same manner as in Example 1, except that sodium quinolate (NaQ) was used instead of LiQ to form the ETL. Thus, 4-[4-(9,10-di-naphthalene-2-yl-anthracene-2-yl)-phenyl]-3,5-diphenyl-4H-[1,2,4]triazole and NaQ were co-deposited to form the ETL.

Example 3

An OLED was prepared in the same manner as in Example 1, except that 3-[4-(9,10-di-naphthalene-2-yl-anthracene-2-yl)-phenyl]-4,5-diphenyl-4H-[1,2,4]triazole was used instead of 4-[4-(9,10-di-naphthalene-2-yl-anthracene-2-yl)-phenyl]-3,5-diphenyl-4H-[1,2,4]triazole in order to form the ETL. Thus, 3-[4-(9,10-di-naphthalene-2-yl-anthracene-2-yl)-phenyl]-4,5-diphenyl-4H-[1,2,4]triazole and LiQ were co-deposited to form the ETL.

Example 4

An OLED was prepared in the same manner as in Example 1, except that the ETL was formed by co-depositing 3-[4-(9,10-di-naphthalene-2-yl-anthracene-2-yl)-phenyl]-4,5-diphenyl-4H-[1,2,4]triazole and NaQ.

Comparative Example 1

An OLED was prepared in the same manner as in Example 1, except that $Alq_3$ was used to form the ETL.

Evaluation Example

Driving voltage, brightness, light-emitting efficiency, and brightness half-life of OLEDs prepared according to Examples 1 to 4 and Comparative Example 1 were measured using a PR650 (Spectroscan) source measurement unit, and the results are shown in Table 1 below.

TABLE 1

| Examples | Driving voltage (V) | Current density (mA/cm2) | Light-emitting efficiency (cd/A) | Brightness half-life (hr) |
| --- | --- | --- | --- | --- |
| Example 1 | about 4.2 | about 13.3 | about 3.0 | about 1310 |
| Example 2 | about 4.2 | about 14.2 | about 3.2 | about 1280 |
| Example 3 | about 4.3 | about 13.2 | about 3.0 | about 1210 |
| Example 4 | about 4.3 | about 13.6 | about 3.1 | about 1190 |
| Comparative Example 1 | about 3.6 | about 11.1 | about 4.1 | about 1210 |

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:
1. An organic light emitting device comprising:
a substrate;
a first electrode;
a second electrode; and
an organic layer interposed between the first electrode and the second electrode, wherein the organic layer comprises a first layer consisting essentially of an organic-metal complex wherein the organic-metal complex of the first layer is a compound selected from the group consisting of:
M(quinolato)(4-[4-(9,10-di-phenyl-2-yl-anthracene-2-yl)-phenyl]-3,5-diphenyl-4H-[1,2,4]triazole),
M(quinolato)(3,5-diphenyl-4-[4-(6-phenyl-anthracene-2-yl)-phenyl]-4H-[1,2,4]triazole),
M(quinolato)(4-[4-(9,10-di-naphthalene-2-yl-anthracene-2-yl)-phenyl]-3,5-diphenyl-4H-[1,2,4]triazole),
M(quinolato)(4-[5-(9,10-di-naphthalene-2-yl-anthracene-2-yl)-thiophene-2-yl]-3,5-diphenyl-4H-[1,2,4]triazole),
M(quinolato)(4-[5-(9,10-di-naphthalene-2-yl-anthracene-2-yl)-furan-2-yl]-3,5-diphenyl-4H-[1,2,4]triazole),
M(quinolato)(4-[5-(9,10-di-naphthalene-2-yl-anthracene-2-yl)-pyrrole-2-yl]-3,5-diphenyl-4H-[1,2,4]triazole),
M(quinolato)(4-[4-(9,10-diphenyl-anthracene-2-yl)-phenyl]-3,5-di-naphthalene-2-yl-4H-[1,2,4]triazole),
M(quinolato)(4-[4-(9,10-di-naphthalene-2-yl-anthracene-2-yl)-phenyl]-3,5-di-naphthalene-2-yl-4H-[1,2,4]triazole),
M(quinolato)(4-[4-(9,10-di-naphthalene-anthracene-2-yl)-phenyl]-3,5-di-naphthalene-1-yl-4H-[1,2,4]triazole),
M(quinolato)(4-[4-(9,10-di-naphthalene-anthracene-2-yl)-phenyl]-3,5-di-naphthalene-1-yl-4H-[1,2,4]triazole),
M(quinolato)(2-(9,10-di-naphthalene-2-yl-anthracene-2-yl)-5-(3,5-diphenyl-[1,2,4]triazole-4-yl)-pyridine),
M(quinolato)(3-(9,10-di-naphthalene-2-yl-anthracene-2-yl)-6-(3,5-diphenyl-[1,2,4]triazole-4-yl)-pyridine),
M(quinolato)(5-(9,10-di-naphthalene-2-yl-anthracene-2-yl)-2-(3,5-diphenyl-[1,2,4]triazole-4-yl)-pyrimidine),
M(quinolato)(3-[4-(9,10-di-phenyl-2-yl-anthracene-2-yl)-phenyl]-4,5-diphenyl-4H-[1,2,4]triazole),
M(quinolato)(4,5-diphenyl-4-[4-(6-phenyl-anthracene-2-yl)-phenyl]-4H-[1,2,4]triazole),
M(quinolato)(3-[4-(9,10-di-naphthalene-2-yl-anthracene-2-yl)-phenyl]-4,5-diphenyl-4H-[1,2,4]triazole),
M(quinolato)(3-[5-(9,10-di-naphthalene-2-yl-anthracene-2-yl)-thiophene-2-yl]-4,5-diphenyl-4H-[1,2,4]triazole),
M(quinolato)(3-[5-(9,10-di-naphthalene-2-yl-anthracene-2-yl)-furan-2-yl]-4,5-diphenyl-4H-[1,2,4]triazole),

M(quinolato)(3-[5-(9,10-di-naphthalene-2-yl-anthracene-2-yl)-pyrrole-2-yl]-4,5-diphenyl-4H-[1,2,4]triazole),
M(quinolato)(3-[4-(9,10-diphenyl-anthracene-2-yl)-phenyl]-4,5-di-naphthalene-2-yl-4H-[1,2,4]triazole),
M(quinolato)(3-[4-(9,10-di-naphthalene-2-yl-anthracene-2-yl)-phenyl]-4,5-di-naphthalene-2-yl-4H-[1,2,4]triazole),
M(quinolato)(3-[4-(9,10-di-naphthalene-anthracene-2-yl)-phenyl]-4,5-di-naphthalene-1-yl-4H-[1,2,4]triazole),
M(quinolato)(3-[4-(9,10-di-naphthalene-anthracene-2-yl)-phenyl]-4,5-di-naphthalene-1-yl-4H-[1,2,4]triazole),
M(quinolato)(2-(9,10-di-naphthalene-2-yl-anthracene-2-yl)-5-(4,5-diphenyl-[1,2,4]triazole-3-yl)-pyridine),
M(quinolato)(3-(9,10-di-naphthalene-2-yl-anthracene-2-yl)-6-(4,5-diphenyl-[1,2,4]triazole-3-yl)-pyridine),
M(quinolato)(5-(9,10-di-naphthalene-2-yl-anthracene-2-yl)-2-(4,5-diphenyl-[1,2,4 ]triazole-3-yl)-pyrimidine),
M(quinolato)(4-[4-(4,9-diphenyl-pyrene-2-yl)-phenyl]-3,5-diphenyl-4H-[1,2,4]triazole),
M(quinolato)(3,5-diphenyl-4-[4-(6-phenyl-pyrene-2-yl)-phenyl]-4H-[1,2,4]triazole),
M(quinolato)(4-[4-(9,10-di-naphthalene-2-yl-pyrene-2-yl)-phenyl]-3,5-diphenyl-4H-[1,2,4]triazole),
M(quinolato)(4-[5-(9,10-di-naphthalene-2-yl-pyrene-2-yl)-thiophene-2-yl]-3,5-diphenyl-4H-[1,2,4]triazole),
M(quinolato)(4-[5-(9,10-di-naphthalene-2-yl-pyrene-2-yl)-furan-2-yl]-3,5-diphenyl-4H-[1,2,4]triazole),
M(quinolato)(4-[5-(9,10-di-naphthalene-2-yl-pyrene-2-yl)-pyrrole-2-yl]-3,5-diphenyl-4H-[1,2,4]triazole),
M(quinolato)(4-[4-(9,10-diphenyl-pyrene-2-yl)-phenyl]-3,5-di-naphthalene-2-yl-4H-[1,2,4]triazole),
M(quinolato)(4-[4-(9,10-di-naphthalene-2-yl-pyrene-2-yl)-phenyl]-3,5-di-naphthalene-2-yl-4H-[1,2,4]triazole),
M(quinolato)(4-[4-(9,10-di-naphthalene-pyrene-2-yl)-phenyl]-3,5-di-naphthalene-1-yl-4H-[1,2,4]triazole),
M(quinolato)(4-[4-(9,10-di-naphthalene-pyrene-2-yl)-phenyl]-3,5-di-naphthalene-1-yl-4H-[1,2,4]triazole),
M(quinolato)(2-(9,10-di-naphthalene-2-yl-pyrene-2-yl)-5-(3,5-diphenyl-[1,2,4]triazole-4-yl)-pyridine),
M(quinolato)(3-(9,10-di-naphthalene-2-yl-pyrene-2-yl)-6-(3,5-diphenyl-[1,2,4]triazole-4-yl)-pyridine),
M(quinolato)(5-(9,10-di-naphthalene-2-yl-pyrene-2-yl)-2-(3,5-diphenyl-[1,2,4]triazole-4-yl)-pyrimidine),
M(quinolato)(3-[4-(9,10-di-phenyl-2-yl-pyrene-2-yl)-phenyl]-4,5-diphenyl-4H-[1,2,4]triazole),
M(quinolato)(4,5-diphenyl-4-[4-(6-phenyl-pyrene-2-yl)-phenyl]-4H-[1,2,4]triazole),
M(quinolato)(3-[4-(9,10-di-naphthalene-2-yl-pyrene-2-yl)-phenyl]-4,5-diphenyl-4H-[1,2,4]triazole),
M(quinolato)(3-[5-(9,10-di-naphthalene-2-yl-pyrene-2-yl)-thiophene-2-yl]-4,5-diphenyl-4H-[1,2,4]triazole),
M(quinolato)(3-[5-(9,10-di-naphthalene-2-yl-pyrene-2-yl)-furan-2-yl]-4,5-diphenyl-4H-[1,2,4]triazole),
M(quinolato)(3-[5-(9,10-di-naphthalene-2-yl-pyrene-2-yl)-pyrrole-2-yl]-4,5-diphenyl-4H-[1,2,4]triazole),
M(quinolato)(3-[4-(9,10-diphenyl-pyrene-2-yl)-phenyl]-4,5-di-naphthalene-2-yl-4H-[1,2,4]triazole),
M(quinolato)(3-[4-(9,10-di-naphthalene-2-yl-pyrene-2-yl)-phenyl]-4,5-di-naphthalene-2-yl-4H-[1,2,4]triazole),
M(quinolato)(3-[4-(9,10-di-naphthalene-pyrene-2-yl)-phenyl]-4,5-di-naphthalene-1-yl-4H-[1,2,4]triazole),
M(quinolato)(3-[4-(9,10-di-naphthalene-pyrene-2-yl)-phenyl]-4,5-di-naphthalene-1-yl-4H-[1,2,4]triazole),
M(quinolato)(2-(9,10-di-naphthalene-2-yl-pyrene-2-yl)-5-(4,5-diphenyl-[1,2,4]triazole-3-yl)-pyridine),
M(quinolato)(3-(9,10-di-naphthalene-2-yl-pyrene-2-yl)-6-(4,5-diphenyl-[1,2,4]triazole-3-yl)-pyridine), and
M(quinolato)(5-(9,10-di-naphthalene-2-yl-pyrene-2-yl)-2-(4,5-diphenyl-[1,2,4]triazole-3-yl)-pyrimidine),
and wherein M is an alkali metal.

2. The organic light emitting device of claim 1, wherein M is Li or Na.

3. The organic light emitting device of claim 1, wherein the first layer is one of an electron transport layer or a hole blocking layer.

4. A method of preparing an organic light emitting device, the method comprising:
  forming a first electrode on a substrate;
  forming an organic layer comprising a first layer consisting essentially of an organic-metal complex on the first electrode; and
  forming a second electrode on the organic layer, wherein the organic-metal complex of the first layer is a compound selected from the group consisting of:
  M(quinolato)(4-[4-(9,10-di-phenyl-2-yl-anthracene-2-yl)-phenyl]-3,5-diphenyl-4H-[1,2,4]triazole),
  M(quinolato)(3,5-diphenyl-4-[4-(6-phenyl-anthracene-2-yl)-phenyl]-4H-[1,2,4]triazole),
  M(quinolato)(4-[4-(9,10-di-naphthalene-2-yl-anthracene-2-yl)-phenyl]-3,5-diphenyl-4H-[1,2,4]triazole),
  M(quinolato)(4-[5-(9,10-di-naphthalene-2-yl-anthracene-2-yl)-thiophene-2-yl]-3,5-diphenyl-4H-[1,2,4]triazole),
  M(quinolato)(4-[5-(9,10-di-naphthalene-2-yl-anthracene-2-yl)-furan-2-yl]-3,5-diphenyl-4H-[1,2,4]triazole),
  M(quinolato)(4-[5-(9,10-di-naphthalene-2-yl-anthracene-2-yl)-pyrrole-2-yl]-3,5-diphenyl-4H-[1,2,4]triazole),
  M(quinolato)(4-[4-(9,10-diphenyl-anthracene-2-yl)-phenyl]-3,5-di-naphthalene-2-yl-4H-[1,2,4]triazole),
  M(quinolato)(4-[4-(9,10-di-naphthalene-2-yl-anthracene-2-yl)-phenyl]-3,5-di-naphthalene-2-yl-4H-[1,2,4]triazole),
  M(quinolato)(4-[4-(9,10-di-naphthalene-anthracene-2-yl)-phenyl]-3,5-di-naphthalene-1-yl-4H-[1,2,4]triazole),
  M(quinolato)(4-[4-(9,10-di-naphthalene-anthracene-2-yl)-phenyl]-3,5-di-naphthalene-1-yl-4H-[1,2,4]triazole),
  M(quinolato)(2-(9,10-di-naphthalene-2-yl-anthracene-2-yl)-5-(3,5-diphenyl-[1,2,4]triazole-4-yl)-pyridine),
  M(quinolato)(3-(9,10-di-naphthalene-2-yl-anthracene-2-yl)-6-(3,5-diphenyl-[1,2,4]triazole-4-yl)-pyridine),
  M(quinolato)(5-(9,10-di-naphthalene-2-yl-anthracene-2-yl)-2-(3,5-diphenyl-[1,2,4]triazole-4-yl)-pyrimidine),
  M(quinolato)(3-[4-(9,10-di-phenyl-2-yl-anthracene-2-yl)-phenyl]-4,5-diphenyl-4H-[1,2,4]triazole),
  M(quinolato)(4,5-diphenyl-4-[4-(6-phenyl-anthracene-2-yl)-phenyl]-4H-[1,2,4]triazole),
  M(quinolato)(3-[4-(9,10-di-naphthalene-2-yl-anthracene-2-yl)-phenyl]-4,5-diphenyl-4H-[1,2,4]triazole),
  M(quinolato)(3-[5-(9,10-di-naphthalene-2-yl-anthracene-2-yl)-thiophene-2-yl]-4,5-diphenyl-4H-[1,2,4]triazole),
  M(quinolato)(3-[5-(9,10-di-naphthalene-2-yl-anthracene-2-yl)-furan-2-yl]-4,5-diphenyl-4H-[1,2,4]triazole),
  M(quinolato)(3-[5-(9,10-di-naphthalene-2-yl-anthracene-2-yl)-pyrrole-2-yl]-4,5-diphenyl-4H-[1,2,4]triazole),
  M(quinolato)(3-[4-(9,10-diphenyl-anthracene-2-yl)-phenyl]-4,5-di-naphthalene-2-yl-4H-[1,2,4]triazole), M(quinolato)(3-[4-(9,10-di-naphthalene-2-yl-anthracene-2-yl)-phenyl]-4,5-di-naphthalene-2-yl-4H-[1,2,4]triazole),
M(quinolato)(3-[4-(9,10-di-naphthalene-anthracene-2-yl)-phenyl]-4,5-di-naphthalene-1-yl-4H-[1,2,4]triazole),
M(quinolato)(3-[4-(9,10-di-naphthalene-anthracene-2-yl)-phenyl]-4,5-di-naphthalene-1-yl-4H-[1,2,4]triazole),
M(quinolato)(2-(9,10-di-naphthalene-2-yl-anthracene-2-yl)-5-(4,5-diphenyl-[1,2,4]triazole-3-yl)-pyridine),
M(quinolato)(3-(9,10-di-naphthalene-2-yl-anthracene-2-yl)-6-(4,5-diphenyl-[1,2,4]triazole-3-yl)-pyridine),
M(quinolato)(5-(9,10-di-naphthalene-2-yl-anthracene-2-yl)-2-(4,5-diphenyl-[1,2,4]triazole-3-yl)-pyrimidine),
M(quinolato)(4-[4-(4,9-diphenyl-pyrene-2-yl)-phenyl]-3,5-diphenyl-4H-[1,2,4]triazole),
M(quinolato)(3,5-diphenyl-4-[4-(6-phenyl-pyrene-2-yl)-phenyl]-4H-[1,2,4]triazole),
M(quinolato)(4-[4-(9,10-di-naphthalene-2-yl-pyrene-2-yl)-phenyl]-3,5-diphenyl-4H-[1,2,4]triazole),
M(quinolato)(4-[5-(9,10-di-naphthalene-2-yl-pyrene-2-yl)-thiophene-2-yl]-3,5-diphenyl-4H-[1,2,4]triazole),
M(quinolato)(4-[5-(9,10-di-naphthalene-2-yl-pyrene-2-yl)-furan-2-yl]-3,5-diphenyl-4H-[1,2,4]triazole),
M(quinolato)(4-[5-(9,10-di-naphthalene-2-yl-pyrene-2-yl)-pyrrole-2-yl]-3,5-diphenyl-4H-[1,2,4]triazole),
M(quinolato)(4-[4-(9,10-diphenyl-pyrene-2-yl)-phenyl]-3,5-di-naphthalene-2-yl-4H-[1,2,4]triazole),
M(quinolato)(4-[4-(9,10-di-naphthalene-2-yl-pyrene-2-yl)-phenyl]-3,5-di-naphthalene-2-yl-4H-[1,2,4]triazole),
M(quinolato)(4-[4-(9,10-di-naphthalene-pyrene-2-yl)-phenyl]-3,5-di-naphthalene-1-yl-4H-[1,2,4]triazole),
M(quinolato)(4-[4-(9,10-di-naphthalene-pyrene-2-yl)-phenyl]-3,5-di-naphthalene-1-yl-4H-[1,2,4]triazole),
M(quinolato)(2-(9,10-di-naphthalene-2-yl-pyrene-2-yl)-5-(3,5-diphenyl-[1,2,4]triazole-4-yl)-pyridine),
M(quinolato)(3-(9,10-di-naphthalene-2-yl-pyrene-2-yl)-6-(3,5-diphenyl-[1,2,4]triazole-4-yl)-pyridine),
M(quinolato)(5-(9,10-di-naphthalene-2-yl-pyrene-2-yl)-2-(3,5-diphenyl-[1,2,4]triazole-4-yl)-pyrimidine),
M(quinolato)(3-[4-(9,10-di-phenyl-2-yl-pyrene-2-yl)-phenyl]-4,5-diphenyl-4H-[1,2,4]triazole),
M(quinolato)(4,5-diphenyl-4-[4-(6-phenyl-pyrene-2-yl)-phenyl]-4H-[1,2,4]triazole),
M(quinolato)(3-[4-(9,10-di-naphthalene-2-yl-pyrene-2-yl)-phenyl]-4,5-diphenyl-4H-[1,2,4]triazole),
M(quinolato)(3-[5-(9,10-di-naphthalene-2-yl-pyrene-2-yl)-thiophene-2-yl]-4,5-diphenyl-4H-[1,2,4]triazole),
M(quinolato)(3-[5-(9,10-di-naphthalene-2-yl-pyrene-2-yl)-furan-2-yl]-4,5-diphenyl-4H-[1,2,4]triazole),
M(quinolato)(3-[5-(9,10-di-naphthalene-2-yl-pyrene-2-yl)-pyrrole-2-yl]-4,5-diphenyl-4H-[1,2,4]triazole),
M(quinolato)(3-[4-(9,10-diphenyl-pyrene-2-yl)-phenyl]-4,5-di-naphthalene-2-yl-4H-[1,2,4]triazole),
M(quinolato)(3-[4-(9,10-di-naphthalene-2-yl-pyrene-2-yl)-phenyl]-4,5-di-naphthalene-2-yl-4H-[1,2,4]triazole),
M(quinolato)(3-[4-(9,10-di-naphthalene-pyrene-2-yl)-phenyl]-4,5-di-naphthalene-1-yl-4H-[1,2,4]triazole),
M(quinolato)(3-[4-(9,10-di-naphthalene-pyrene-2-yl)-phenyl]-4,5-di-naphthalene-1-yl-4H-[1,2,4]triazole),
M(quinolato)(2-(9,10-di-naphthalene-2-yl-pyrene-2-yl)-5-(4,5-diphenyl-[1,2,4]triazole-3-yl)-pyridine),
M(quinolato)(3-(9,10-di-naphthalene-2-yl-pyrene-2-yl)-6-(4,5-diphenyl-[1,2,4]triazole-3-yl)-pyridine), and
M(quinolato)(5-(9,10-di-naphthalene-2-yl-pyrene-2-yl)-2-(4,5-diphenyl-[1,2,4]triazole-3-yl)-pyrimidine),
and wherein M is an alkali metal.

5. The method of claim 4, wherein M is Li or Na.

6. The method of claim 4, wherein the first electrode is formed by depositing or sputtering a high-work function material that is used to form the first electrode on the substrate.

7. The method of claim 4, wherein the first layer is one of an electron transport layer or a hole blocking layer.

8. The method of claim 4, wherein a hole injection layer (HIL) layer, a organic emission layer (EML) layer, an electron transport layer (ETL) layer and an electron injection layer (EIL) layer are sequentially formed on the first electrode prior to the forming of the second electrode.

* * * * *